United States Patent
Wang

(10) Patent No.: US 9,209,204 B2
(45) Date of Patent: Dec. 8, 2015

(54) THIN FILM TRANSISTOR ARRAY PANEL AND METHOD OF MANUFACTURING THE SAME

(71) Applicant: Samsung Display Co., Ltd., Yongin (KR)

(72) Inventor: In Soo Wang, Seongnam-si (KR)

(73) Assignee: Samsung Display Co., Ltd., Yongin (KR)

(*) Notice: Subject to any disclaimer, the term of this patent is extended or adjusted under 35 U.S.C. 154(b) by 83 days.

(21) Appl. No.: 14/063,451

(22) Filed: Oct. 25, 2013

(65) Prior Publication Data
US 2015/0001476 A1  Jan. 1, 2015

(30) Foreign Application Priority Data
Jun. 26, 2013 (KR) .......................... 10-2013-0073922

(51) Int. Cl.
*H01L 27/32* (2006.01)
*H01L 27/12* (2006.01)
*G09G 3/32* (2006.01)

(52) U.S. Cl.
CPC .......... *H01L 27/124* (2013.01); *H01L 27/3276* (2013.01); *H01L 27/3297* (2013.01); *G09G 3/3233* (2013.01); *G09G 2300/0861* (2013.01); *H01L 27/3262* (2013.01)

(58) Field of Classification Search
CPC ................................................... H01L 27/3297
See application file for complete search history.

(56) References Cited

U.S. PATENT DOCUMENTS

| | | | |
|---|---|---|---|
| 6,490,021 B1 * | 12/2002 | Koyama | 349/139 |
| 6,781,155 B1 * | 8/2004 | Yamada | 257/72 |
| 7,830,476 B2 * | 11/2010 | Park | 349/69 |
| 7,855,507 B2 | 12/2010 | Kim | |
| 2006/0102900 A1 * | 5/2006 | Shin et al. | 257/59 |
| 2011/0025585 A1 | 2/2011 | Kim et al. | |
| 2013/0037818 A1 | 2/2013 | Lee et al. | |
| 2013/0044046 A1 * | 2/2013 | Huang et al. | 345/76 |
| 2013/0049024 A1 | 2/2013 | Choi et al. | |

FOREIGN PATENT DOCUMENTS

| | | |
|---|---|---|
| KR | 10-0666645 | 1/2007 |
| KR | 10-0721945 | 5/2007 |
| KR | 10-0899158 | 5/2009 |

* cited by examiner

*Primary Examiner* — Stephen W Smoot
(74) *Attorney, Agent, or Firm* — H.C. Park & Associates, PLC

(57) ABSTRACT

A thin film transistor array panel and a method of manufacturing the same, the thin film transistor array panel including: a polysilicon thin film transistor formed on a substrate, in which a source region and a drain region of a semiconductor layer of the thin film transistor are electrically connected to a power supply line. The power supply line is configured to apply a voltage to remove a floating state of a polysilicon semiconductor layer.

12 Claims, 9 Drawing Sheets

THIN FILM TRANSISTOR ARRAY PANEL AND METHOD OF MANUFACTURING THE SAME

CROSS-REFERENCE TO RELATED APPLICATION

This application claims priority from and the benefit of Korean Patent Application No. 10-2013-0073922, filed on Jun. 26, 2013, which is hereby incorporated by reference for all purposes as if fully set forth herein.

BACKGROUND

1. Field

Exemplary embodiments of the present invention relate to a thin film transistor array panel and a method of manufacturing the same.

2. Discussion of the Background

A thin film transistor array panel is used as a circuit board for independently driving each pixel in a flat panel display, such as an organic light emitting diode display or a liquid crystal display. In the thin film transistor array panel, a thin film transistor is basically a switching element passing a signal at a source side to a drain side, according to a gate signal.

In the case of the liquid crystal display, the thin film transistor transfers a data voltage transferred from a data wire to a pixel electrode, or interrupts the data voltage according to the gate signal transferred through a gate wire.

In an organic light emitting diode display, generally, a switching thin film transistor and a driving thin film transistor are used. If the gate signal is applied to the switching thin film transistor, a data signal passes through the switching thin film transistor to be applied to the driving thin film transistor and a storage capacitor, and if the driving thin film transistor is opened, a current passes from a power supply line through the driving thin film transistor to be applied to an organic light emitting element. In addition, in an organic light emitting diode display, thin film transistors for compensating for the driving thin film transistor are used.

Since the thin film transistors of the thin film transistor array panel are formed on an insulating substrate such as glass, a semiconductor layer exists in a floating state. Accordingly, if a gate voltage is changed, coupling occurs at source/drain nodes, due to a parasitic capacitance of the thin film transistor. This may negatively affect a circuit and result in a reduction of the display quality of a display device.

The above information disclosed in this Background section is only for enhancement of understanding of the background of the invention and therefore it may contain information that does not constitute prior art.

BRIEF SUMMARY OF THE INVENTION

Exemplary embodiments of the present invention has been made in an effort to provide a thin film transistor array panel that can stabilize a characteristic of a thin film transistor, and a method of manufacturing the same.

Exemplary embodiments of the present invention provide a thin film transistor array panel including: a polysilicon thin film transistor formed on a substrate, in which a source region and a drain region of a semiconductor layer of the thin film transistor are electrically connected to a power supply line. The thin film transistor may be a p-type thin film transistor.

Other exemplary embodiments of the present invention provide a method of manufacturing a thin film transistor array panel, including: forming a semiconductor layer on a substrate; forming a first insulating layer on the semiconductor layer; forming a gate electrode on the first insulating layer; forming a second insulating layer on the gate electrode; forming first contact holes in the first insulating layer and the second insulating layer, the first contact holes exposing a first portion of a source region and a first portion of a drain region of the semiconductor layer; forming source and drain electrodes on the second insulating layer, the source and drain electrodes extending through the first contact holes to be respectively connected to the source region and the drain region of the semiconductor layer; and forming a first passivation layer on the source and drain electrodes; forming second contact holes in the first insulating layer, the second insulating layer, and the first passivation layer, so as to expose a second portion of the source region and a second portion of the drain region of the semiconductor layer; and forming a power supply line on the first passivation layer, the first power supply line being connected to the source region and the drain region of the semiconductor layer through the second contact holes.

Yet another exemplary embodiment of the present invention provides an organic light emitting diode display, including: a plurality of pixels each including a plurality of thin film transistors, in which at least one thin film transistor of the plurality of thin film transistors is a p-type polysilicon thin film transistor, and in the at least one of the polysilicon thin film transistors, a source region and a drain region of a semiconductor layer are electrically connected to a power supply line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
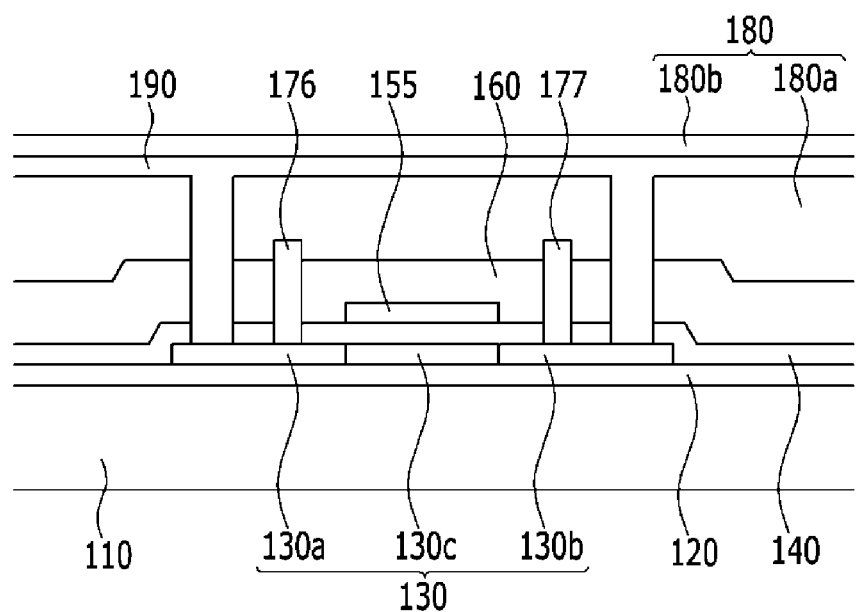
FIG. 1 is a cross-sectional view illustrating a layer structure of a thin film transistor array panel according to an exemplary embodiment of the present invention.
Figure 2:
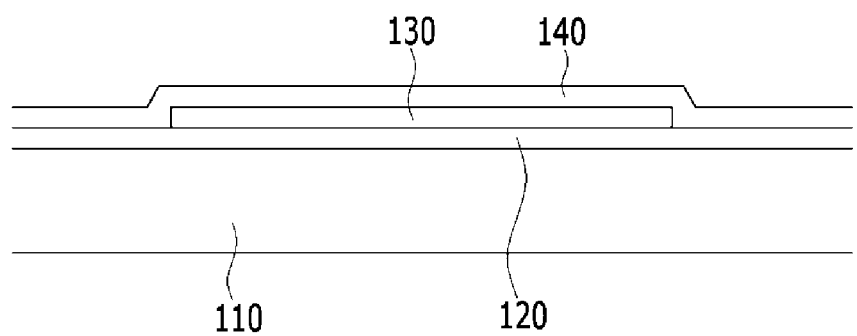
FIGS. 2 to 7 are cross-sectional views schematically illustrating manufacturing processes of the thin film transistor array panel illustrated in FIG. 1.
Figure 3:
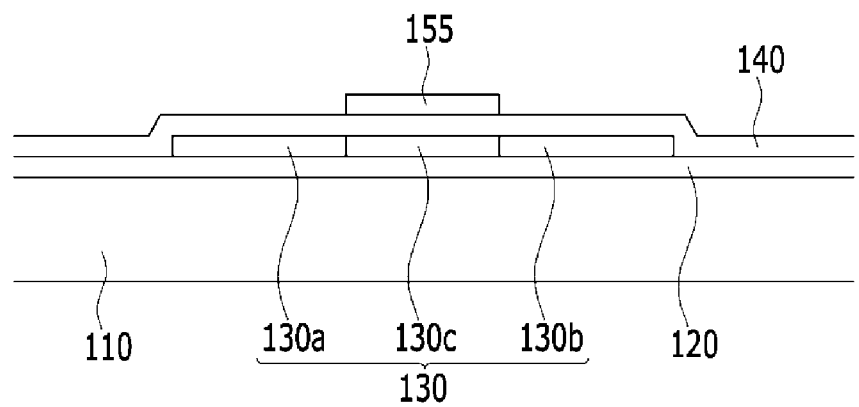

Aspects of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is a cross-sectional view illustrating a layer structure of a thin film transistor array panel according to an exemplary embodiment of the present invention. FIGS. 2 to 7 are cross-sectional views schematically illustrating manufacturing processes of the thin film transistor array panel illustrated in FIG. 1.

In the thin film transistor array panel, at least one thin film transistor such as, a switching thin film transistor and a driving thin film transistor, may be formed on a substrate 110. The thin film transistor may be a polysilicon (poly-Si) thin film transistor, and hereinafter, the polysilicon thin film transistor will be described. In the drawings, only one thin film transistor is illustrated for the convenience of description, but a plurality of thin film transistors may be formed on the substrate 110 and may have the same structure.

Referring to FIG. 1, the thin film transistor is includes a semiconductor layer 130, a gate electrode 155, a source electrode 176, and a drain electrode 177. In this exemplary embodiment, the thin film transistor may be referred to as a top gate type thin film transistor, because the gate electrode 155 is positioned on top of the semiconductor layer 130.

A gate insulating layer 140 is interposed between the semiconductor layer 130 and the gate electrode 155. An interlayer insulating layer 160 is interposed between the gate electrode 155 and the source electrode 176 and the drain electrode 177. A passivation layer 180, including a first passivation layer 180a and a second passivation layer 180b, is formed on the source electrode 176 and the drain electrode 177. A power supply line 190 is formed between the first passivation layer 180a and the second passivation layer 180b.

The semiconductor layer 130 includes a source region 130a and a drain region 130b in which an impurity is doped at a high concentration. The source region 130a and the drain region 130b are respectively electrically connected to the source electrode 176 and the drain electrode 177, through first contact holes C1 and C2 (see FIG. 4) that extend through the gate insulating layer 140 and the interlayer insulating layer 160. Further, the source region 130a and the drain region 130b are electrically connected to the power supply line 190 through second contact holes C3 and C4 (see FIG. 6) that extend through the gate insulating layer 140, the interlayer insulating layer 160, and the first passivation layer 180a.

The second contact holes C3 and C4 are formed to be positioned farther away from the gate electrode 155, as compared to the first contact holes C1 and C2. Portions of the source region 130a and the drain region 130b, which are connected to the power supply line 190, are positioned farther away from a channel region 130c, as compared to portions connected to the source electrode 176 and the drain electrode 177.

Now, referring to FIGS. 2 to 8, a detailed constitution of the thin film transistor array panel and a method of manufacturing the same will be described. The substrate 110 is formed of a transparent insulating material such as glass and plastic. For example, the substrate 110 may be formed of borosilicate-based glass having a heat-resistant temperature of 600° C. or more. The substrate 110 may be formed of a plastic such as PET (polyethylene terephthalate), PEN (polyethylene naphthalate), and polyimide, and the plastic substrate may be applied as a flexible substrate.

An interrupting layer 120 may be formed on an upper surface of the substrate 110. The interrupting layer 120 prevents the diffusion of the impurity, thereby preventing a degradation of the characteristics of the semiconductor and prevents the permeation of moisture or the external air. The interrupting layer 120 also planarizes the substrate 110. The interrupting layer may be referred to as a barrier layer or a buffer layer. The interrupting layer 120 may be formed of $SiO_x$ and/or $SiN_x$, in a single layer or multiple layers, by a deposition method such as a PECVD (plasma enhanced chemical vapor deposition) method, an APCVD (atmospheric pressure CVD) method, and a LPCVD (low pressure CVD) method. The interrupting layer 120 may be omitted according to the type of substrate or process conditions.

The semiconductor layer 130 may be formed to have a predetermined pattern, for example, by depositing amorphous silicon using a plasma CVD method, performing a dehydrogenation treatment to remove hydrogen included in amorphous silicon, forming a polysilicon state through a laser crystallization method, such as excimer laser annealing, and performing a photolithography process and an etching process. The semiconductor layer 130 may be divided into the source region 130a, the drain region 130b, and the channel region 130c, and these regions may be formed by impurity doping, as will be described later.

The gate insulating layer 140 is formed on the semiconductor layer 130. The gate insulating layer 140 may be formed of an inorganic insulating material such as $SiO_x$, $SiN_x$, SiON, $Al_2O_3$, TiO, $Ta_2O_5$, $HfO_2$, $ZrO_2$, BST, and PZT, by a deposition method such as a PECVD method, a LPCVD method, an APCVD method, and an ECR-CVD method. Generally, silicon oxide ($SiO_x$) or silicon nitride ($SiN_x$) is frequently used.

The gate electrode 155 is formed on a portion of the gate insulating layer 140. The gate electrode 155 may be formed of a conductive metal layer, such as Al, MoW, Cr, or Al/Cu, but is not necessarily limited thereto. In addition to the metal material, various conductive materials, including a conductive polymer, may be used as the gate electrode 155. The gate electrode 155 may be formed by forming a metal layer by a deposition method such as a sputtering method, and then performing patterning by the photolithography process and the etching process.

The gate electrode 155 is formed to cover a region corresponding to the channel region 130c of the semiconductor layer 130. The source region 130a and the drain region 130b are formed on opposing sides of the channel region 130c, by doping the impurity into the semiconductor layer 130 using the gate electrode 155 as a self-aligned mask. The impurity may be a p-type impurity such as a boron (B) ion, or an n-type impurity such as a phosphorus (P) ion. Generally, the impurity is a p-type impurity. An activation treatment may be performed after ion doping.

The interlayer insulating layer 160 is formed to cover the gate insulating layer 140 and the gate electrode 155. The interlayer insulating layer 160 may be formed of an inorganic insulating layer material such as $SiO_x$, $SiN_x$, SiON, $Al_2O_3$, TiO, $Ta_2O_5$, $HfO_2$, $ZrO_2$, BST, or PZT. The interlayer insulating layer 160 may be formed of a material having a refractive index that is different from that of the gate insulating layer 140. For example, the gate insulating layer 140 may be formed of $SiO_x$, and the interlayer insulating layer 160 may be formed of $SiN_x$. The interlayer insulating layer 160 is formed to have a sufficient thickness to act as an insulating layer between the gate electrode 155 and the source electrode 176 and the drain electrode 177. The interlayer insulating layer 160 may be formed of an organic insulating layer as well as the inorganic insulating layer, and the organic insulating layer and the inorganic insulating layer may be alternately formed as a stack of multiple layers.

Figure 4:
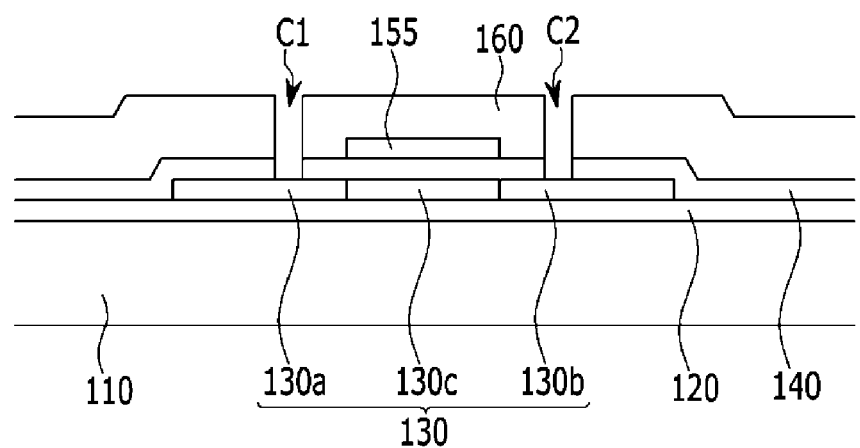

After the interlayer insulating layer 160 is formed, the first contact holes C1 and C2 may be formed as illustrated in FIG. 4. The first contact holes C1 and C2 may be formed by patterning the gate insulating layer 140 and the interlayer insulating layer 160 using photolithography and etching processes.

Figure 5:
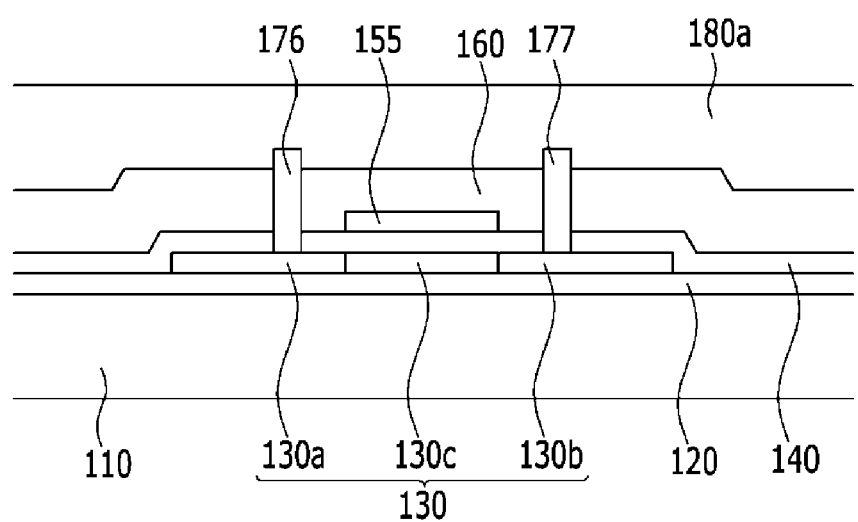

The source electrode 176 and the drain electrode 177 may be formed after forming the first contact holes C1 and C2, by depositing the metal layer by a deposition method such as sputtering, and patterning the metal layer using photolithography and etching processes. As illustrated in FIG. 5, the source electrode 176 and the drain electrode 177 are connected to the source region 130a and the drain region 130b, respectively, through the first contact holes C1 and C2. The source electrode 176 and the drain electrode 177, for example, may have a multi-layered structure of Ti/Al/Ti layers.

As described above, after the thin film transistor is formed on the substrate 110, the first passivation layer 180a is formed. Examples of the material of the first passivation layer 180a may include a general polymer (PMMA, PS), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, a blend thereof, and the like. The first passivation layer 180a may be formed of the inorganic insulating material, as well as the aforementioned organic insulating material, and may have a multi-layered structure where the organic insulating material and the inorganic insulating material are alternately layered.

Figure 6:
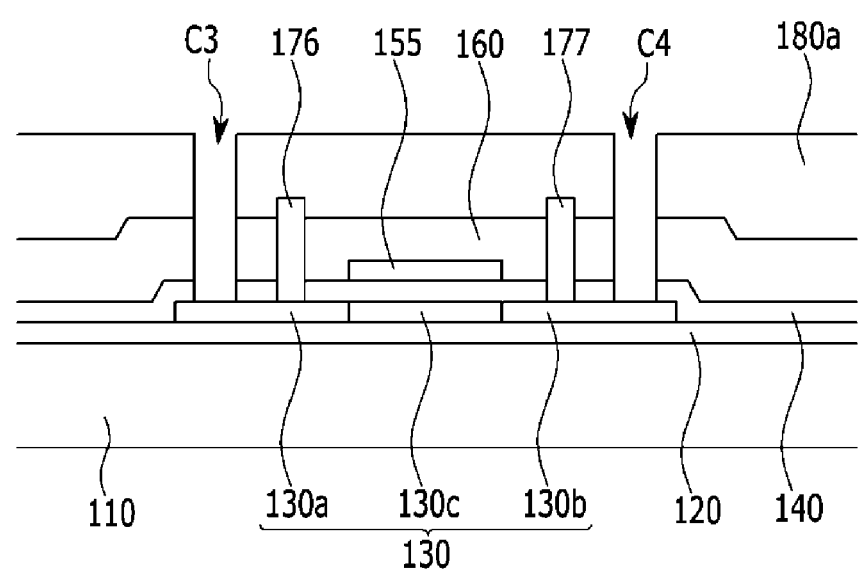

After the first passivation layer 180a is formed, the second contact holes C3 and C4 may be formed by patterning the gate insulating layer 140, the interlayer insulating layer 160, and the first passivation layer 180a, using the photolithography and etching processes. As illustrated in FIG. 6, the second contact holes C3 and C4 are positioned farther away from the gate electrode 155, as compared to the source electrode 176 and the drain electrode 177.

Figure 7:
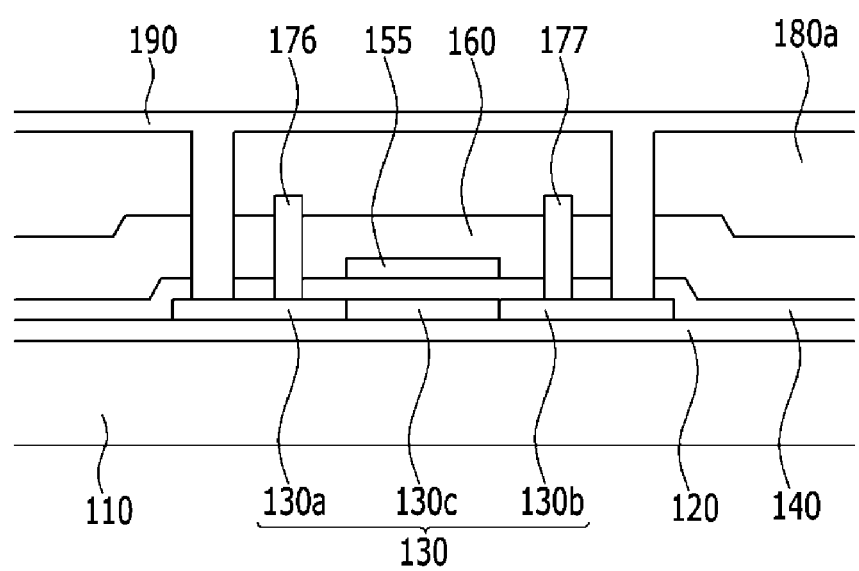

After the second contact holes C3 and C4 are formed, the power supply line 190 is formed by depositing the conductive metal layer using a deposition method such as sputtering. As illustrated in FIG. 7, the power supply line 190 is connected through the second contact holes C3 and C4 to the source region 130a and the drain region 130b of the semiconductor layer 130. The power supply line 190 is formed to overlap with the semiconductor layer 130.

The power supply line 190 may be a power wire supplying a high level or positive (+) power voltage VDD, or a power wire supplying a low level or negative (−) ground voltage VSS. In the case where the aforementioned thin film transistor is a p-type thin film transistor, the power supply line 190 may be a power wire supplying a high level or positive power voltage VDD. On the contrary, in the case where the thin film transistor is an n-type thin film transistor, the power supply line 190 may be a power wire supplying a low level or negative ground voltage VSS. Since the power supply line 190 is electrically connected to the semiconductor layer 130 to hold the semiconductor layer 130 at the VDD voltage, a bulk floating state of the thin film transistor may be prevented.

As illustrated in FIG. 1, the second passivation layer 180b may be formed on the power supply line 190. The second passivation layer 180b may be formed of the organic insulating material and/or the inorganic insulating material, like the first passivation layer 180a. The second passivation layer 180b may be formed of the same material as the first passivation layer 180a.

Figure 8:
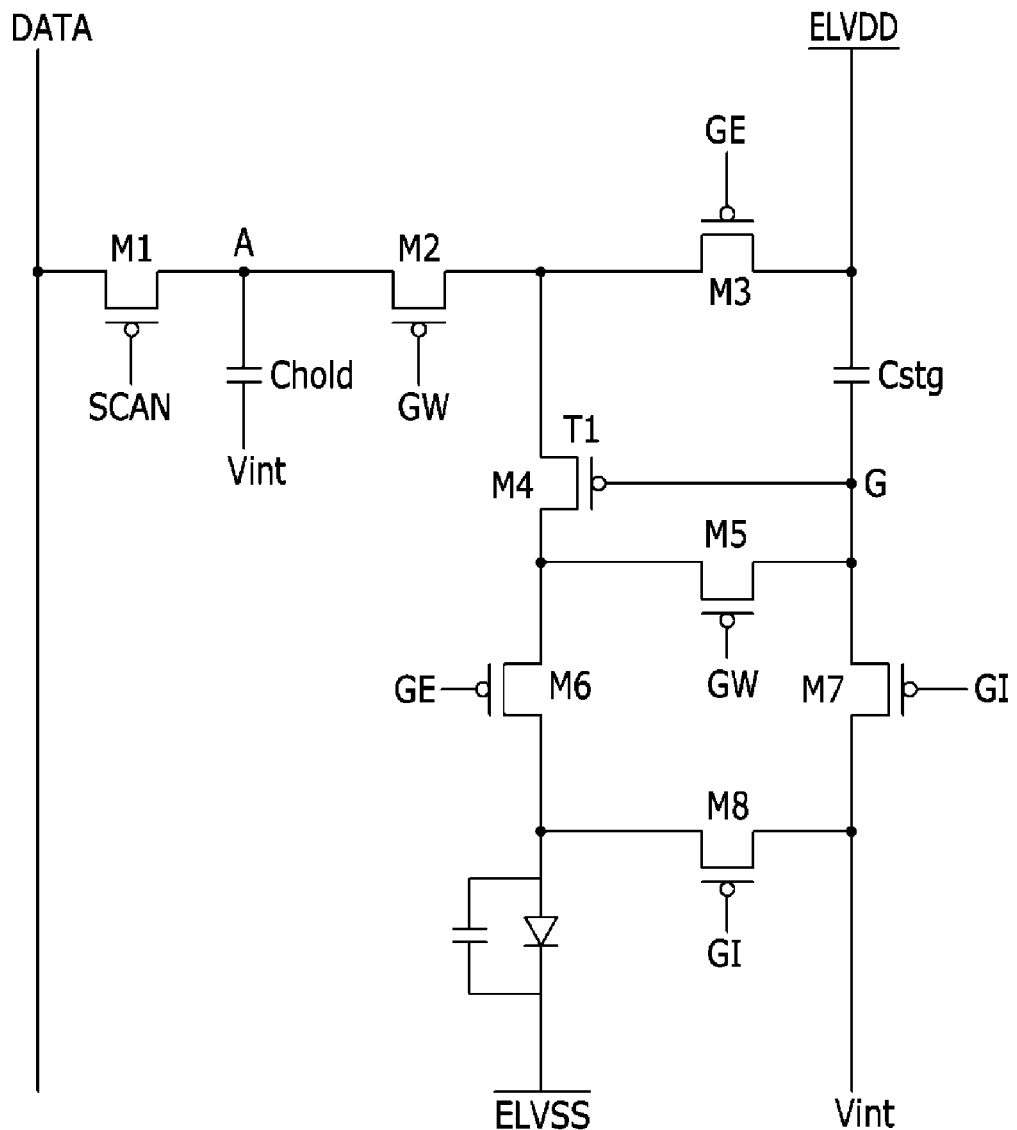
FIG. 8 is a circuit diagram illustrating an example of a pixel structure of an organic light emitting diode display.
Figure 9:
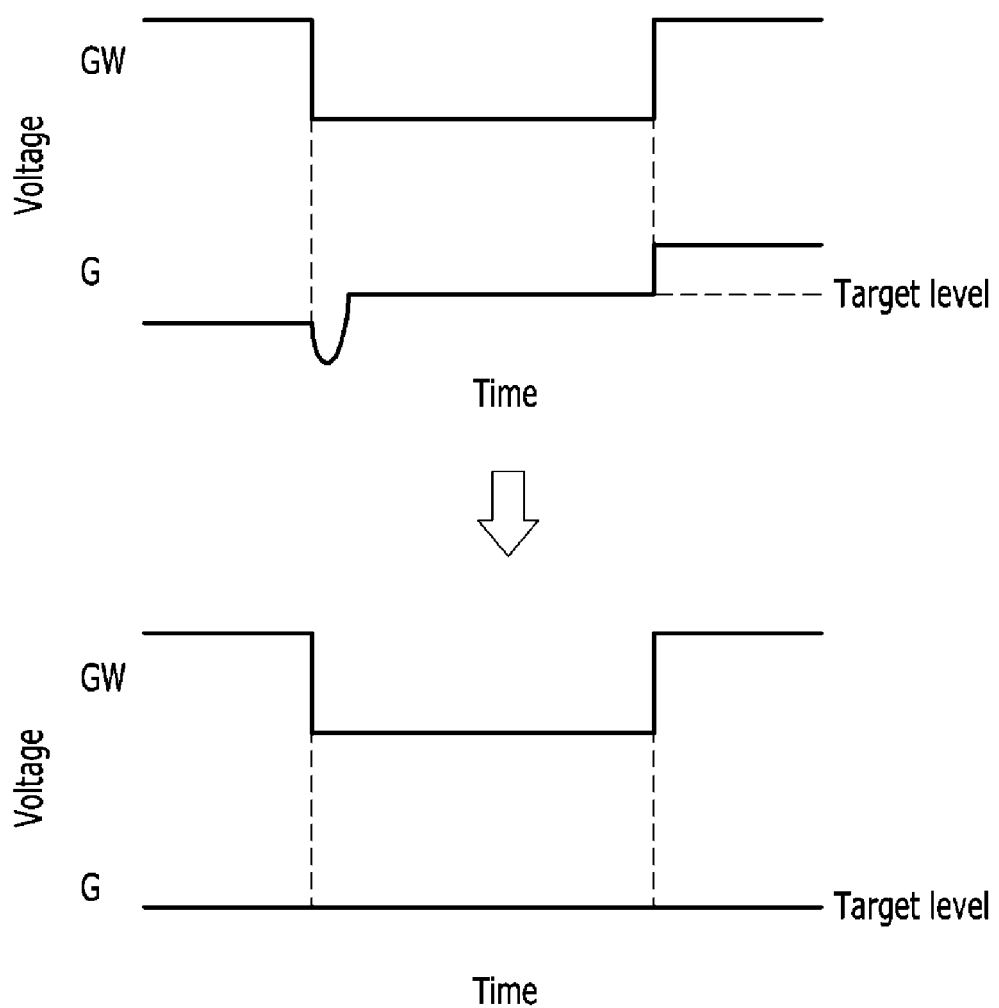
FIG. 9 is a view illustrating a voltage characteristic in a certain node before and after a thin film transistor according to the exemplary embodiment of the present invention is applied in a circuit of FIG. 8.

FIG. 8 is a circuit diagram illustrating an example of a pixel structure of the organic light emitting diode display, and FIG. 9 is a view illustrating a voltage characteristic in a certain node before and after the thin film transistor is applied with a voltage in a circuit of FIG. 8.

Referring to FIG. 8, the pixel structure includes a pixel circuit where eight thin film transistors M1-M8 and three capacitors are connected to drive an organic light emitting diode (OLED). Among the thin film transistors, M1 is a switching transistor, M2 and M5 are write transistors, M3 and M6 are light emitting transistors, M4 is a driving transistor, and M7 and M8 are initialization transistors. These thin film transistors are preferably p-type polysilicon thin film transistors.

If a signal is applied to a gate of the switching transistor M1, according to a scanning signal SCAN, the switching transistor M1 is opened, and a data signal DATA passes through the switching transistor M1 to be stored in a capacitor Chold. The initialization transistors M7 and M8 are turned on by an initialization signal GI to set an initial value at major nodes.

While the write transistors M2 and M5 are opened according to a write signal GW, the data signal stored in the capacitor Chold compensates for a threshold voltage Vth of the driving transistor M4, through the write transistor M5, to apply a voltage to a node G. Since the write transistor M5 compensates for the driving transistor M4, the write transistor M5 may be referred to as a compensation transistor.

While the light emitting transistor M6 is opened according to a light emitting signal GE, a current is applied from a power supply line ELVDD to the organic light emitting diode to emit light. The degree of opening of the driving transistor M4 varies according to the magnitude of the data signal, to adjust an amount of the current flowing through the driving transistor M4, thus displaying a grayscale.

Since the thin film transistors are formed on an insulating substrate, the semiconductor layer of each transistor is in a floating state. In the floating state, a coupling noise may occur due to a parasitic capacitance internally occurring in a thin film transistor element. This causes, for example, a problem in the write transistor M5 and the node G connected thereto in the circuit. As illustrated in FIG. 8, a source terminal of the write transistor M5 is connected to a drain terminal of the driving transistor M4, a drain terminal of the write transistor M5 is connected through the node G to a gate terminal of the driving transistor M4, and a data bias is applied to the driving transistor.

The upper drawing of FIG. 9 illustrates an occurrence of the noise in the node G due to the parasitic capacitance and bulk floating occurring in the write transistor M5 by a change in write signal GW. When the write signal GW is turned off, a voltage change may occur in the node G, and thus, the bias that is higher than a target level may be applied. Consequently, a level of the current passing through the driving transistor M4 is changed, and as a result, a light emitting level of the organic light emitting diode may become different from an intention matter to reduce a display quality of the organic light emitting diode display.

The lower drawing of FIG. 9 illustrates a level change of the node G when the ELVDD power supply line is connected to the polysilicon semiconductor layer of the write transistor M5 as described in the aforementioned exemplary embodiment of the present invention, in order to minimize the coupling effect due to bulk floating of the write transistor M5.

Since the ELVDD voltage stops the floating state of the semiconductor layer of the write transistor M5, by holding the semiconductor layer at an ELVDD voltage, the junction coupling effect occurring in the doping region of the semiconductor layer can be minimized. Accordingly, in the write transistor M5 that is not in the floating state, as illustrated in the lower drawing of FIG. 9, even though a gate voltage that is the write signal GW fluctuates, the noise and the voltage change may not occur at the node G corresponding to the source/drain terminals thereof, and a desired target level bias may be formed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel comprising:
   a thin film transistor (TFT) formed on a substrate and comprising a semiconductor layer comprising a source region and a drain region; and
   a power supply line directly electrically connected to the source region and the drain region of the semiconductor layer.

2. The thin film transistor array panel of claim 1, wherein the TFT is a p-type TFT.

3. The thin film transistor array panel of claim 1, wherein:
   the TFT comprises the semiconductor layer disposed on a substrate, a first insulating layer disposed on the semiconductor layer, a gate electrode disposed on the first insulating layer, a second insulating layer disposed on the gate electrode, source and drain electrodes respectively connected to the source region and the drain region of the semiconductor layer, a first passivation layer disposed on the second insulating layer, and the power supply line disposed on the first passivation layer;
   the source and drain electrodes extend through first contact holes formed in the first insulating layer and the second insulating layer to contact the semiconductor layer; and
   the power supply line extends through second contact holes formed in the first insulating layer, the second insulating layer, and the first passivation layer to contact the semiconductor layer.

4. The thin film transistor array panel of claim 3, further comprising a second passivation layer is disposed on the power supply line.

5. The thin film transistor array panel of claim 4, wherein the first passivation layer and the second passivation layer are formed of the same material.

6. The thin film transistor array panel of claim 3, further comprising an interrupting layer disposed between the substrate and the semiconductor layer.

7. The thin film transistor array panel of claim 3, wherein each of the second contact holes is disposed farther away from the gate electrode than each of the first contact holes.

8. The thin film transistor array panel of claim 1, wherein the power supply line is configured to apply a voltage to the semiconductor layer, such that the semiconductor layer is not in a floating state.

9. An organic light emitting diode display, comprising:
   pixels that each comprise a polysilicon thin film transistor (TFT) that comprises a p-type semiconductor layer comprising a source region and a drain region; and
   a power supply line directly electrically connected to the source and drain regions of each p-type semiconductor layer.

10. The organic light emitting diode display of claim 9, wherein:
    each of the polysilicon TFTs comprises an interrupting layer disposed on a substrate, the p-type semiconductor layer disposed on the interrupting layer, a first insulating layer disposed on the p-type semiconductor layer, a gate electrode disposed on the first insulating layer, a second insulating layer disposed on the gate electrode, source and drain electrodes respectively connected to the source and drain regions, a first passivation layer disposed on the second insulating layer, the power supply line disposed on the first passivation layer, and a second passivation layer disposed on the power supply line;
    the source and drain electrodes extend through first contact holes formed in the first insulating layer and the second insulating layer, to contact the p-type semiconductor layer; and
    the power supply line extends through second contact holes formed in the first insulating layer, the second insulating layer, and the first passivation layer, to contact the p-type semiconductor layer.

11. The organic light emitting diode display of claim 9, wherein:
    the pixels each further comprise a switching TFT, a driving TFT, and a compensation TFT to compensate the driving TFT; and
    the polysilicon TFT is the compensation TFT where a source terminal and a drain terminal thereof are respectively connected to a drain terminal and a gate terminal of the driving TFT.

12. The organic light emitting diode display of claim 9, wherein the power supply line is configured to apply a voltage to the p-type semiconductor layer, such that the p-type semiconductor layer is not in a floating state.

* * * * *